(12) United States Patent
Gevorgyan et al.

(10) Patent No.: US 7,936,235 B2
(45) Date of Patent: May 3, 2011

(54) METHOD TO INCREASE THE TUNEABILITY OF VARACTORS

(75) Inventors: Spartak Gevorgyan, Göteborg (SE); Harald Jacobsson, Västra Frölunda (SE); Anatoli Deleniv, Göteborg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 293 days.

(21) Appl. No.: 11/916,583

(22) PCT Filed: Jun. 9, 2005

(86) PCT No.: PCT/SE2005/000866
§ 371 (c)(1), (2), (4) Date: Dec. 5, 2007

(87) PCT Pub. No.: WO2006/132570
PCT Pub. Date: Dec. 14, 2006

(65) Prior Publication Data
US 2008/0197947 A1    Aug. 21, 2008

(51) Int. Cl.
*H03H 7/01* (2006.01)
(52) U.S. Cl. ........ 333/99 S; 333/171; 333/174; 333/175
(58) Field of Classification Search .................. 333/171, 333/174, 175, 99 S
See application file for complete search history.

(56) References Cited

U.S. PATENT DOCUMENTS

| | | | |
|---|---|---|---|
| 4,399,559 A | | 8/1983 | Theriault |
| 5,618,777 A | * | 4/1997 | Hey-Shipton et al. ........ 505/210 |
| 6,084,486 A | * | 7/2000 | Suzuki et al. ................. 333/174 |
| 6,088,214 A | * | 7/2000 | Malone et al. ................ 361/278 |
| 6,710,693 B2 | * | 3/2004 | Matsumoto et al. .......... 336/110 |
| 7,174,147 B2 | * | 2/2007 | Toncich et al. ............... 455/339 |
| 7,221,327 B2 | * | 5/2007 | Toncich ....................... 343/860 |

FOREIGN PATENT DOCUMENTS
GB    2312345    10/1997

* cited by examiner

*Primary Examiner* — Robert Pascal
*Assistant Examiner* — Kimberly E Glenn

(57) ABSTRACT

The present invention relates to a tunable circuit, or admittance, arrangement comprising at least one capacitive branch with at least a tunable first capacitor, and tuning application means. It further comprises at least one resonant branch comprising at least a second capacitor and an inductor, said second capacitor and said inductor being connected in series. Said at least one capacitive branch and said at least one resonant branch are connected in parallel, and said tuning application means are adapted for application of a DC tuning voltage. The capacitance of said first and/or second capacitor and/or the inductance of said inductor are selected such that the frequency dependency of the tunability of a varactor arrangement forming the equivalent varactor arrangement of the admittance arrangement can be controlled at least in a selected frequency range.

22 Claims, 8 Drawing Sheets

METHOD TO INCREASE THE TUNEABILITY OF VARACTORS

FIELD OF THE INVENTION

The present invention relates to a tunable circuit arrangement, particularly to a tunable admittance arrangement, comprising at least one capacitive branch with at least a tunable first capacitor, and tuning application means. The invention also relates to a method of providing a tunable circuit or admittance arrangement and of tuning said arrangement.

STATE OF THE ART

Tunable capacitors, or more particularly tunable capacitors in which the capacitance can be changed depending on a DC voltage applied thereto, so called varactors, constitute one of the key components in electronic circuits, particularly in microwave circuits. The hence tunable capacitors are used in several applications, for example in radio frequency circuits, microwave circuits, as for example tunable filters, phase shifters, delay lines, Voltage Control Oscillators (VCOs) etc. Mostly known varactors are realized by means of semiconductor technology, e.g. by DC biasing semiconductor junctions such as p-n junctions, Sckottky barrier junctions etc. Semiconductor varactors however suffer from low quality, Q, factors, specially at high frequencies, low power handling capability and high intermodulation distortion. For example at frequencies above 2 GHz, the Q factor of such a varactors decreases rapidly. Varactors can also be realized using Micro-Electro-Mechanical (MEM) switches and as dielectric varactors based on a dielectric material, the dielectric constant of which can be varied. The capacitance of dielectric varactors is tuned by means of the application of a control (DC) voltage to change the dielectric constant in the tunable dielectric material. The dielectric varactors generally have high Q factors, high power handling capability, low intermodulation distortion, a wide capacitance range. In addition thereto they can be fabricated at a low cost. Tunable dielectric or ferroelectric materials are materials (as referred to above) in which the dielectric constant can be varied by varying the strength of an electric field applied to the materials. Ferroelectric varactors are characterized by a fractional change or tunability of the capacitance under DC bias, i.e. a DC bias voltage applied to a device changes its capacitance.

For a large number of applications a high tunability is one of the most important requirements. However, one of the most fundamental problems of the varactors is that they often have a low tunability. Usually the tunability is limited by the fundamental physical properties of the materials used in the varactors, e.g. semiconductor materials, MEM, dielectrics or ferroelectrics. However for several applications higher tunabilities than can be achieved with known varactors are needed.

SUMMARY OF THE INVENTION

What is needed is therefore a tunable circuit arrangement, particularly a tunable admittance arrangement, which has a high tunability. Particularly an arrangement is needed through which the limitations, particularly as far as tunability is concerned, caused by material related factors can be overcome or reduced. Still further an arrangement is needed which is easy to fabricate. Furthermore an arrangement is needed which can be fabricated at a low cost. Moreover an arrangement is needed which has a high Q factor, particularly, or also at high frequencies, most particularly at very high frequencies of up to 10 or 100 or even in the teraherz region, but also at low frequencies. An arrangement is also needed which has a high power handling capability and low intermodulation distortion and wide capacitance range. Furthermore an arrangement is needed which can be tailored for implementation or application specific needs e.g. as far as frequency range is concerned, allowed frequency dependent deviation of the capacitance. Particularly an arrangement is needed through which the tunability, at least in a given frequency range, can be controlled or which can be built such that the desired tunability can be achieved to a desired or predetermined extent. A method for providing such an arrangement is also needed.

Therefore a tunable circuit arrangement, or particularly a tunable admittance arrangement, as initially referred to, is provided which further comprises at least one resonant branch comprising at least a second capacitor and an inductor, whereby said second capacitor and said inductor are connected in series and whereby further said at least one capacitive branch and said at least one resonant branch are connected in parallel, and wherein further said tuning application means are adapted for application of a DC tuning voltage.

The capacitance of said first and/or second capacitor and/or the inductance of said inductor are particularly selected such that the frequency dependence of an equivalent varactor arrangement of said admittance arrangement or circuit arrangement, can be controlled at least in a selected frequency range. Particularly the frequency dependence of the equivalent capacitance can be controlled such as to vary depending on frequency to a given extent only or have a given tolerance in said frequency range. In a particular embodiment the capacitance of the first capacitor is of substantially the same order of magnitude as the capacitance of the second capacitor. Particularly both the first and the second capacitors are variable, i.e. constitute varactors. In another implementation at least one of said first and second capacitors is variable or comprises a varactor.

Particularly the equivalent capacitance of the circuit or admittance arrangement in a given or selected frequency range is substantially frequency independent, or frequency independent with a given allowed deviation. Most particularly the equivalent capacitance of the circuit or admittance arrangement in a given or selected frequency range deviates within given allowed limits.

An arrangement according to a particular embodiment comprises a first capacitor or a first capacitive branch which is tunable. Particularly the second resonator of the resonating branch is tunable to a limited extent, or tunable to an extent which is considerably less than the tunability of said first capacitor, or even not tunable.

Particularly the equivalent capacitance of the circuit arrangement is given by the frequency range where the frequency $\omega$ is higher than the parallel resonant frequency $\omega_{2p}$.

In a particular embodiment the capacitive branch comprises a first variable capacitance arrangement with a primary first capacitor connected in parallel with a secondary first capacitor connected in series with a (second) inductor. The resonating branch comprises the second capacitor in series with the (first) inductor and the arrangement hence comprises five active elements, cf. the preceding embodiments wherein only three active elements are included. It should be clear that there may of course also be even more active elements which in principle gives an even better tunability but makes the devices somewhat more complicated. In principle it should be clear that there may be four, five or six or even more active elements.

In one embodiment the arrangement is made of a ferroelectric material, particularly the varactors, such as of $BaSrTiO_3$ BSTO, with a tunable dielectric constant. WO 02/23633 describes dielectric varactors with offset, two-layer electrodes and in this document a number of materials are described that can be used for ferroelectric varactors, such as ceramic ferroelectric materials or ceramic ferroelectric composite materials or generally BST composites or for example zirkonium based compounds, magnesium based compounds or BSTO-MgO composites.

Particularly thin film ferroelectrics are used but in principle also bulk or thick film ferroelectrics can be used. Conductive means, e.g. of a metal, are disposed on the ferroelectric, which are placed in electrical contact with for example transmission lines in tuning devices. Particularly the arrangement with the varactors is made of a polymer material or of a liquid crystal material. Still further it may comprise a superconducting material such as YBCO or some other appropriate material. It may be a high or low temperature superconducting material.

The conductive materials can be of any conventional kinds such as gold, silver, copper, platinum, or any conducting material compatible with the tunable films and to the electrodes a biasing voltage may be applied.

Substrate layers may, as it is conventional, comprise MgO, $Al_2O_3$, $LaAlO_3$, sapphire, quarts, GaAs etc.

It should be clear that the arrangement is not limited to any particular size, but for illustrative purposes an example is given as 10×50 μm, for example between 5-20×30-70 μm. It should be clear that other sizes, larger as well as smaller, are of course possible or depending on e.g. number of active elements and/or application where they are to be used and fabrication technology, advantageous. Particularly the tuning application means comprises biasing means adapted to apply a DC biasing voltage to the arrangement to change the dielectric constant, in case of a ferroelectric material or dielectric material. The arrangement may be arranged or adapted to operate in different frequency regions, or ranges, particularly in the GHz range, for example at about 1-10 GHz, n×10 GHz, wherein n=1, . . . , 9 or in the n×100 GHz region or even higher, e.g. the THz region. A frequency range may be selected or established and the active components be selected in dependence thereon while also taking the acceptable deviation of the tunability (or frequency dependence within specified limits) in said frequency range into account. This means that e.g. if a very high tunability is needed, the active components may be selected accordingly and/or the number of active components may be selected accordingly (more active components enable a higher tunability within a fixed frequency range), i.e. it may e.g. be negotiated between the frequency range of interest, acceptable deviation (or specified limits), and the extent of tunability.

It may of course also be selected to operate in a frequency range lower than the GHz region. According to different implementations the arrangement may be adapted to be used in a phase shifter, in a tunable filter or in a tunable matching circuit or similar.

It should also be clear that the first and/or second capacitors (or further capacitors if arrangements with more than three active components are used), may be implemented as parallel or parallel plate or multilayer varactors in a circular, elliptical, rectangular, square shaped, interdigital or other appropriate shape.

The invention therefore also suggests a phase shifter or a tunable filter or a matching circuit or similar including one or more arrangements as described in the foregoing.

The invention therefore also suggests a method of providing a tunable circuit arrangement, particularly admittance arrangement, comprising the steps of; providing a capacitive branch with at least one tunable first capacitor; providing a resonant branch with at least a tunable second capacitor and an inductor connected in series, said capacitive and resonant branches being connected in parallel; establishing a frequency range; establishing the maximum allowable tolerance or frequency dependent deviation of a varactor forming the equivalent varactor of the tunable circuit arrangement or tunable admittance arrangement in said frequency range; selecting the capacitance of the first and second capacitors and the inductance of the inductor so in dependence of one another that the frequency dependence of the admittance arrangement forming the equivalent varactor arrangement can be controlled in said frequency range.

Particularly the method further comprises the steps of; selecting the capacitance of said first or said second capacitor as a reference parameter capacitor; fixing the capacitance of said reference parameter capacitor; calculating the capacitance of said other capacitor or capacitors not used as a reference parameter capacitor and the inductance of said inductor using said fixed capacitance value, the upper and lower frequency values of the selected frequency range defining the frequency range and the maximum allowable tolerance or deviation or limits.

Particularly the method includes the step of applying a DC biasing voltage for tuning the equivalent varactor arrangement.

Particularly the method includes the step of establishing a maximum allowable deviation in percentage, for example 10%. Of course it may also be any other percentage, 1, 2 . . . 9, 11 . . . 50 or even higher; this is merely given as an example.

Particularly the varactors are varactors comprising a dielectric or ferroelectric substrate with a tunable dielectric constant, for example of BSTO, and electrodes of a superconducting material.

BRIEF DESCRIPTION OF THE DRAWINGS

The invention will in the following be further described, in a non-limiting manner, and with reference to the accompanying drawings, in which.

DETAILED DESCRIPTION OF THE INVENTION

Figure 1A:
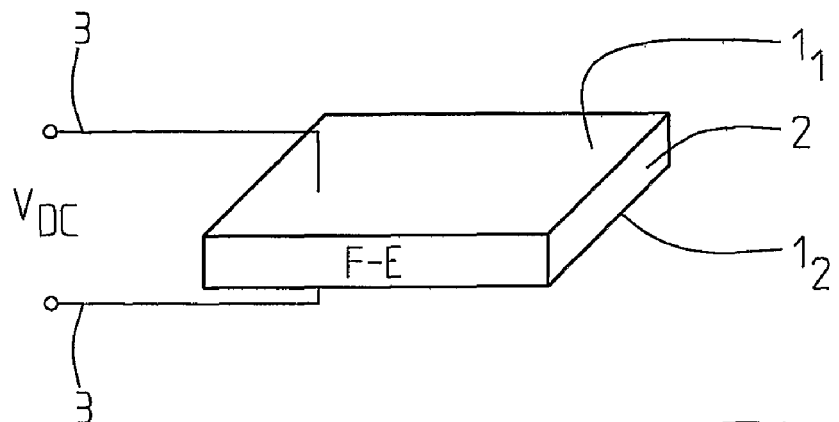
FIG. 1A shows a simple physical realization of a ferroelectric varactor.

FIG. 1A very schematically illustrates a simple ferroelectric varactor which may comprise a lumped capacitor based on a ferroelectric material. Here it comprises a ferroelectric material 2 interposed between two conductive layers $1_1$, $1_2$ and which can be tuned by means of a DC biasing voltage $V_{DC}$ applied through application means 3,3 which changes the dielectric constant of the ferroelectric material.

Figure 1B:
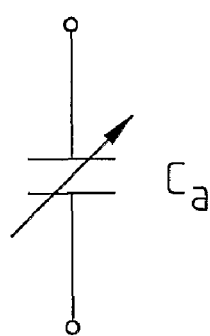
FIG. 1B shows the equivalent circuit representation of the varactor of FIG. 1.

FIG. 1B schematically illustrates the equivalent circuit representation of the varactor of FIG. 1A with a variable capacitance $C_a$. As referred to earlier in the application, ferroelectric varactors can be realized in a variety of electrode shapes such as circular, rectangular, interdigital etc. and may comprise planar, parallel plate, multilayer structures etc.

Figure 2A:
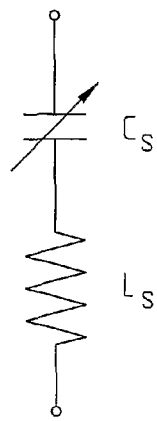
FIG. 2A schematically illustrates a series resonant LC tank.

For explanatory reasons, FIG. 2A shows an LC resonance tank with a capacitor $C_s$ and an inductor $L_s$ connected in series. It is supposed that the serial LC contour resonance tank utilizes a varactor with a specified fixed tunability given by $$T_c(V) = \frac{C(0) - C(V)}{C(V)}$$

wherein 0 relates to the capacitance in the absence of application of a biasing voltage, and wherein C(V) relates to the capacitance at application of a biasing voltage V.

Figure 2B:
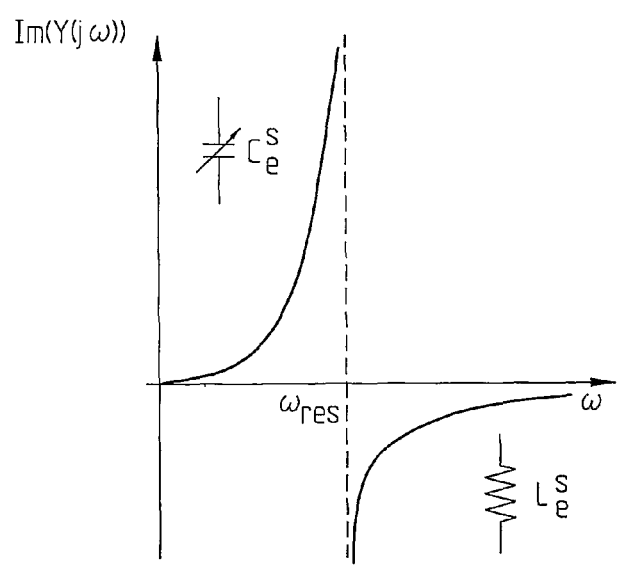
FIG. 2B is a diagram illustrating the input admittance for the series resonant LC tank of FIG. 2A versus frequency, FIG. 3A schematically illustrates a parallel resonant LC tank.

In FIG. 2B the input admittance of the serial resonant tank of FIG. 2A is illustrated as a function of the frequency ω. Below and above the resonant frequency $\Omega_{res}$, each resonant tank can be represented as an equivalent capacitor/varactor or inductor. Whether it is an equivalent capacitor or an equivalent inductor, depends on the sign of the tank admittance Y(jω). A positive admittance corresponds to that of an equivalent capacitor $C_e^s(\omega)$, whereas a negative admittance corresponds to that of an equivalent inductor as can be seen in FIG. 2B. Close to the resonant frequency $\omega_{res}$, such equivalent capacitance/varactor $C_e^s$ has a higher tunability than the original tank varactor C. This effect is mainly a narrow band effect, but it can be of considerable interest for several applications, for example for ferroelectric and superconductor elements or any other components where high Q inductors are available.

Figure 3A:
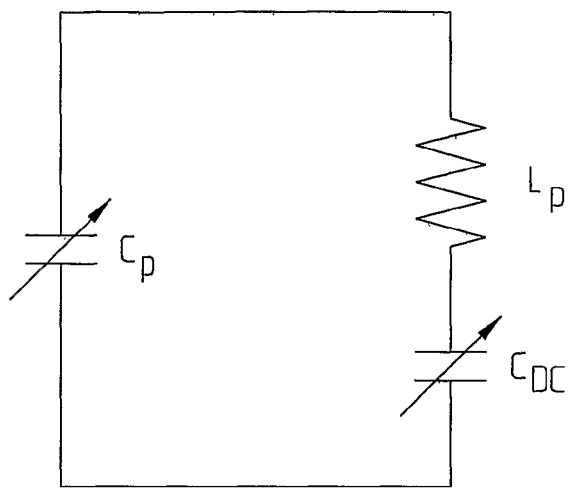
FIG. 3B is a diagram illustrating the input admittance for the parallel resonant LC tank of FIG. 3A.

FIG. 3A shows a corresponding parallel LC tank with a capacitor $C_p$ which is tunable, i.e. a varactor connected in parallel with an inductor $L_p$. However, for such a parallel tank a decoupling capacitor $C_{DC}$ is to be connected in series with the inductor in order to avoid short circuit at DC biasing for microwave implementations. This decoupling capacitor $C_{DC}$ has a capacitance which is much higher than the capacitance of the capacitor $C_p$. Also in this case, close to the resonant frequency, such equivalent capacitance varactor $C_e^p$ has a higher tunability than the original tank varactor C. Like in the preceding series connection case, this is a narrow band effect.

Figure 3B:
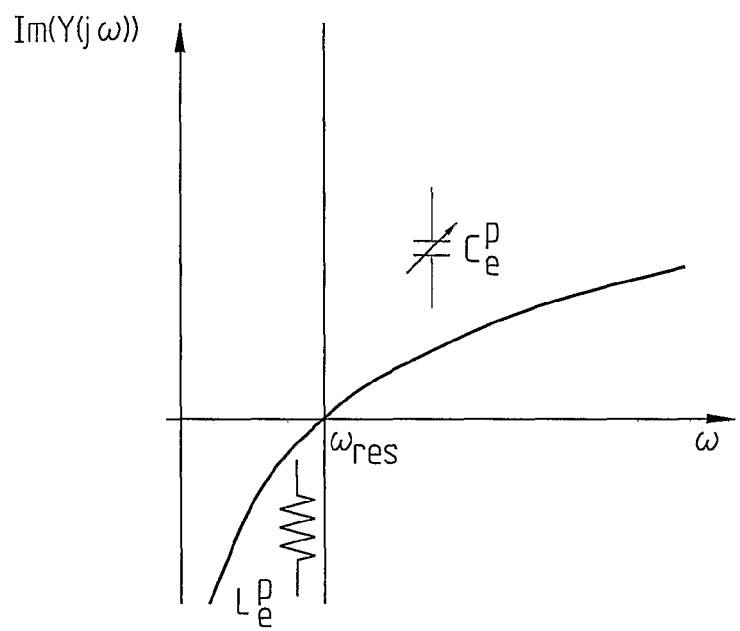

The input admittance of the parallel LC tank is shown FIG. 3B which is a figure similar to FIG. 2B.

If Y(jω)>0, it is an equivalent capacitor whereas if it is <0 it results in an equivalent inductor. The equivalent capacitance of the arrangement is frequency dependent, which is undesirable. The maximum allowed frequency dependent deviation k of the equivalent capacitor (varactor) $C_e^s$ or $C_e^p$ in a frequency band, $\omega_2 > \omega_1$, is defined as:

$$k = \frac{C_e(\omega_2)}{C_e(\omega_1)}$$

$\omega_1$ being the lower frequency and $\omega_2$ being the upper frequency of the frequency band. If $C_e^s(\omega_1)$ or $C_e^p(\omega_1)$, k and $\omega_2$ are specified, the L-C elements of the resonance tanks are defined uniquely as follows:

For the series resonant tank:

$$L = \frac{k-1}{kC_e^s(\omega_1)(\omega_2^2 - \omega_1^2)}$$

$$C = \frac{C_e^s(\omega_1)}{1 + \omega_1^2 L C_e^s(\omega_1)}$$

For the parallel resonant tank:

$$L = \frac{1}{C_e^p(\omega_1)(k-1)}\left(\frac{1}{\omega_1^2} - \frac{1}{\omega_2^2}\right)$$

$$C = C_e^p(\omega_1) + \frac{1}{\omega_1^2 L}$$

If an equivalent tunable capacitor has a capacitance 1 pF and k=1.25 (i.e. 25% allowed deviation), and the frequency band is taken to 5-6 GHz, for a serial resonant tank L=0.4606 nH, C=0.6875 pF whereas for the parallel resonant tank L=1.238 nH and C=1.818 pF.

The voltage dependence of a capacitor/varactor C(V) is here assumed to be:

$$C(V) = \frac{C(0)}{\sqrt{1+V}}$$

The achieved tunability at V=1 of the equivalent capacitance $T_e^{s(p)}(\omega, V)$ is given by:

$$T_e^{s(p)}(V) = \frac{C_e^{s(p)}(0) - C_e^{s(p)}(V)}{C_e^{s(p)}(V)}$$

which for both the serial and the parallel tank capacitors will be T(V)=0.414 and is frequency independent.

Figure 4:
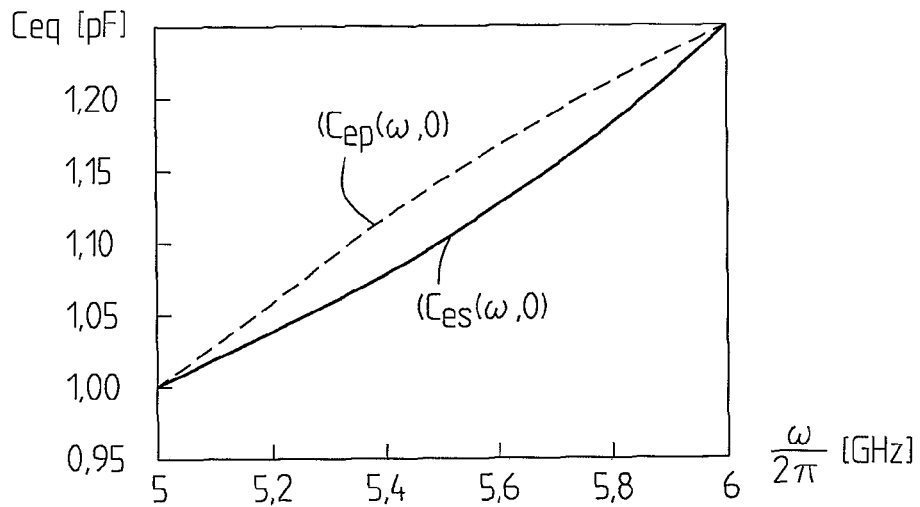
FIG. 4 is a diagram showing the frequency dependence for two equivalent capacitors of two exemplary serial and parallel resonant tanks respectively.

In FIG. 4 the frequency dependencies of the equivalent varactors are illustrated for the serial tank (full line) and the parallel tank, (dashed line). It can be seen that the equivalent capacitance value changes exactly 25% in the 5-6 GHz range as was prescribed.

It can be shown that the tunability of the equivalent capacitors in the specified frequency range of 5-6 GHz for the serial tank increases from about 0.6 to about 0.75 whereas it, for the parallel tank, decreases from about 1.15 to about 0.75 which should be compared with the tunability for a simple frequency independent capacitor, which constantly is 0.414.

Hence the parallel circuit will be more beneficial than the serial resonant tank in terms of achieved tunability in the entire frequency range. However, the parallel tank requires a decoupling capacitor (inductance is short at DC), which constitutes an additional element.

Figure 5:
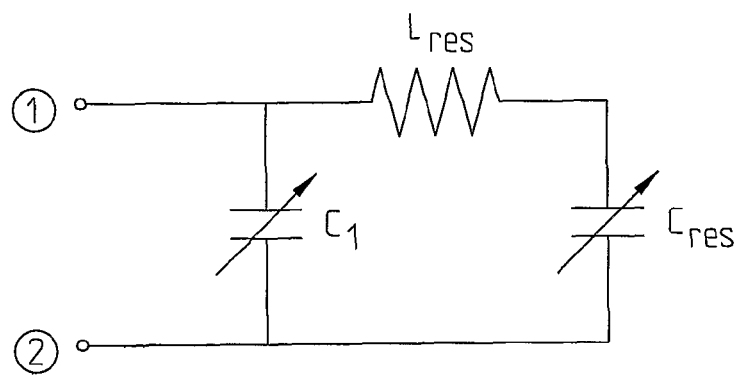
FIG. 5 shows a circuit arrangement comprising three active elements according to one embodiment of the present invention.

However, according to the present invention it has been realized that the tunability can be even more increased if an arrangement for example as in FIG. 5 is used which comprises a capacitive branch with a capacitor C1 and a resonant branch with a second capacitor $C_{res}$ connected in series with an inductor $L_{res}$, where C1 and $C_{res}$ are comparable in size, i.e. capacitance.

Figure 6:
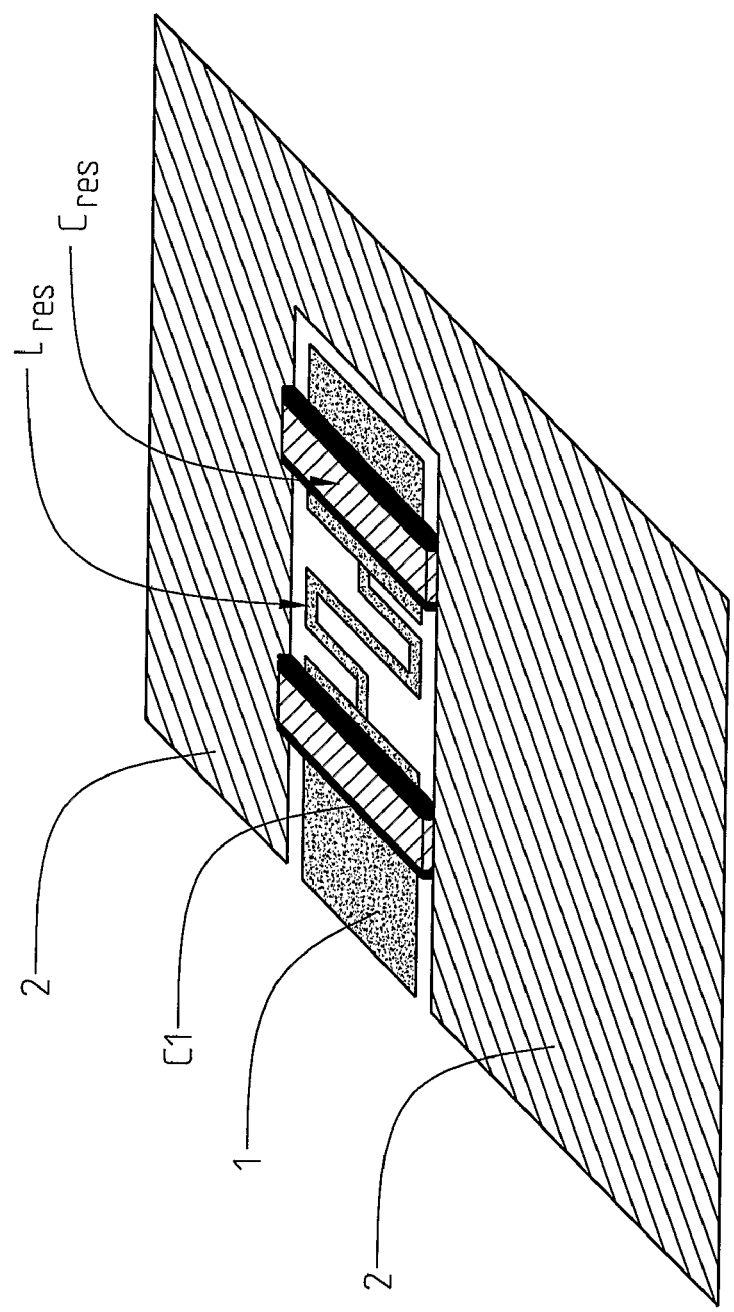
FIG. 6 illustrates an exemplary layout of a circuit arrangement as in FIG. 5.

FIG. 6 schematically illustrates an embodiment of a layout for realization of the arrangement of FIG. 5. The input impedance of the arrangement between nodes 1 and 2 is the impedance of the equivalent varactor. The values of the elements $L_{res}$, and $C_{res}$ are to be chosen so that the branch comprised of these two elements, i.e. the resonant branch, works above the resonance frequency, and hence can be represented by an equivalent inductor $L_{eqv}$. Since the $C_{res}$ is a tunable element, the equivalent inductor will be a tunable element too. The input admittance of the arrangement is a parallel connection of the capacitor admittance with the equivalent inductor. The size of the arrangement may be about 10×50 μm which of course merely constitutes an example.

Figure 7A:
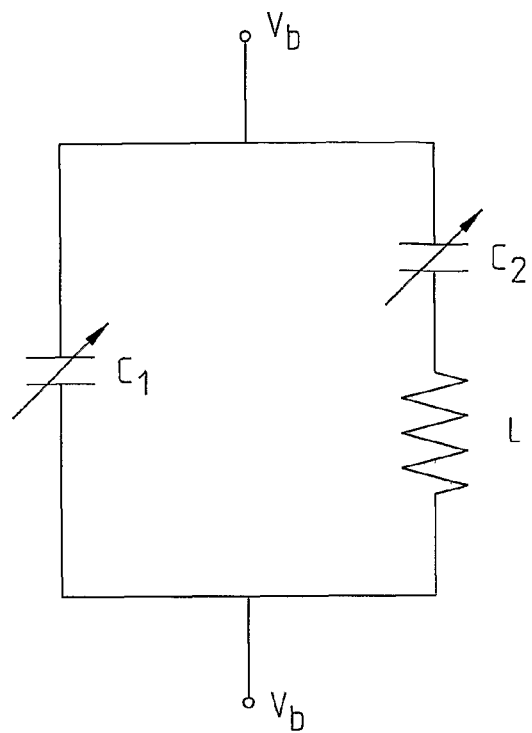
FIG. 7A shows a circuit arrangement comprising three active elements to which a DC bias is applied.

FIG. 7A shows a circuit arrangement according to an advantageous implementation of the present invention with a capacitive branch comprising a capacitor $C_1$ which is tunable, and a resonant branch comprising a second capacitor $C_2$ connected in series with an inductor L. A tuning (biasing) voltage $V_b$ can be applied to the arrangement. It should be clear that the second capacitor $C_2$ is or may be tunable but generally not to a large extent. Furthermore, its capacitance should be of the same order of magnitude as the first capacitance $C_1$ and the main intention with it is not to avoid short circuit at microwaves which is different from the embodiment shown in FIG. 3 in which the decoupling capacitor has a very high capacitance. Hence, it has been realized that through appropriate selection of the tree active elements $C_1$, $C_2$ and L, wherein the capacitances $C_1$ and $C_2$ should be of substantially the same size, it is possible to increase the tunability of the equivalent capacitor in a selected frequency range.

Figure 7B:
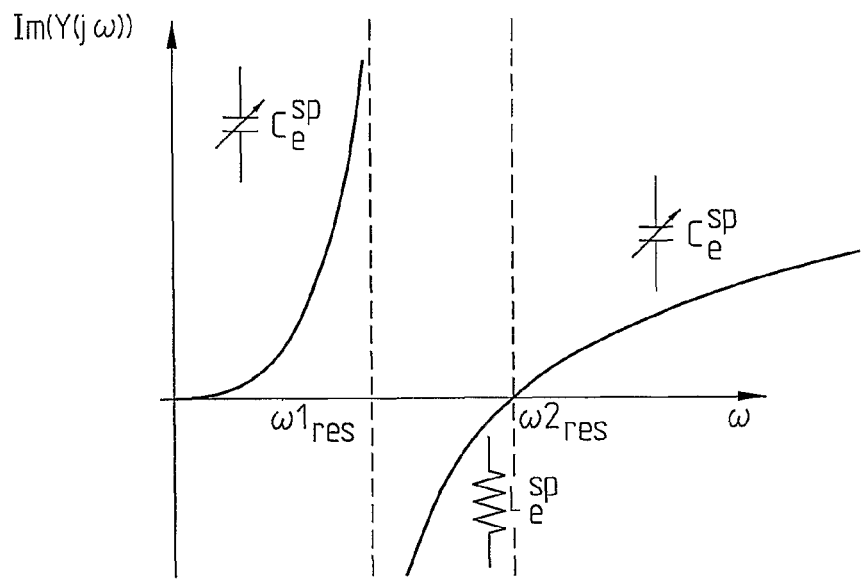
FIG. 7B is a diagram illustrating the input admittance as a function of the frequency for the circuit arrangement according to FIG. 7A.

FIG. 7B is a diagram illustrating the input admittance of the three element circuit arrangement described in FIG. 7A. It can be shown that the tunability in the area above $\omega 2_{res}$ can be increased and substantially (or to a given extent) frequency independent or frequency dependent within fixed limits. It can be seen from FIG. 7B that two areas (when $\omega<\omega 1_{res}$ and when $\omega 2_{res}<\omega$) introduce the equivalent capacitance. Since the circuit arrangement comprises three active elements, one of them is according to the invention used as a parameter to uniquely define the two others. It is here supposed that a similar set of predefined data, $C_e^{sp}(\omega_1)$, k and $\omega_2$, of the equivalent varactor is to be realized. It is supposed that when these are given or defined, the elements of the arrangement of FIG. 7A can be found as explained below. First it is supposed that the capacitance $C_1$ forms the fixed parameter value, and hence is fixed, and then the values for the other elements can be found as:

$$m = \frac{kC_e^{sp}(\omega_1) - C_1}{C_e^{sp}(\omega_1) - C_1}$$

$$L = \frac{(m-1)}{(kC_e^{sp}(\omega_1) - C_1)(\omega_2^2 - \omega_1^2)}$$

$$C_2 = \frac{C_e^{sp}(\omega_1) - C_1}{1 + \omega_1^2 L(C_e^{sp}(\omega_1) - C_1)}$$

It can be seen that for $\omega 2_{res}<\omega$, the arrangement comprising three active elements as described in FIG. 7A will provide a significant increase of the equivalent tunable varactor $C_e^{sp}(\omega_1)$ performance.

Figure 8A:
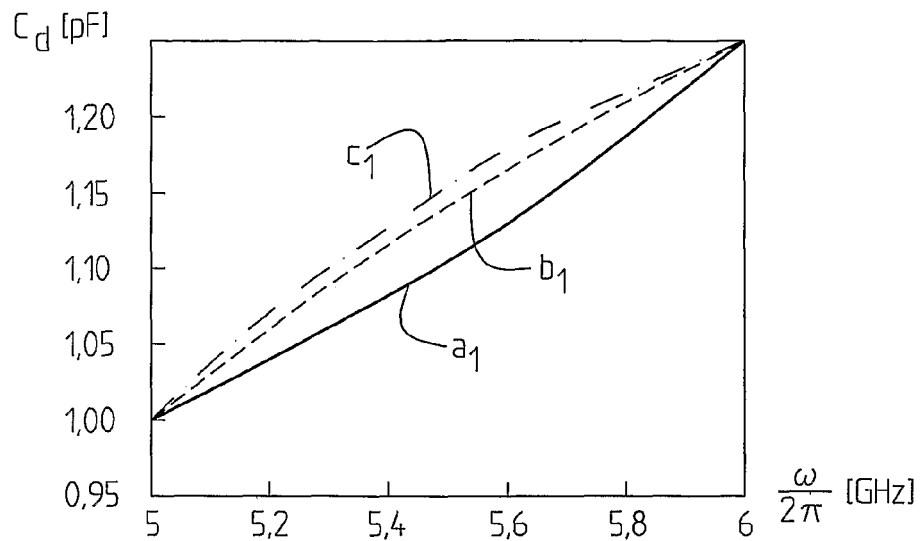
FIG. 8A illustrates the frequency dependence of the equivalent tunable varactor according to FIG. 7A compared to the frequency dependence of the serial and parallel tank varactors of FIGS. 1A and 2A respectively.

FIG. 8A shows the frequency dependencies for the equivalent tunable varactor for a serial ($a_1$) tank embodiment, parallel ($b_1$) tank embodiment and for a three element ($c_1$) embodiment according to FIG. 7A.

Figure 8B:
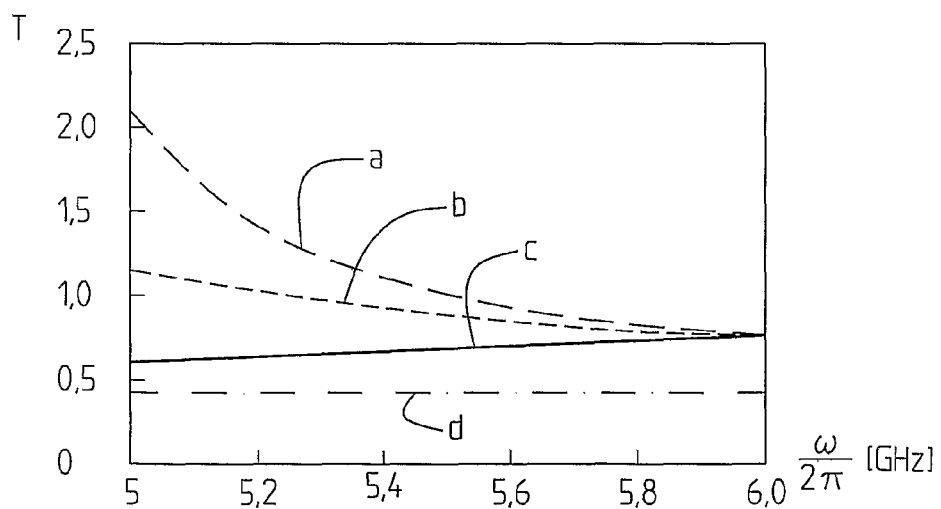
FIG. 8B illustrates the tunability of the equivalent varactors as in FIG. 9A in the 5-6 GHz frequency band, and FIG. 9 schematically illustrates a circuit arrangement according to the present invention with five active elements.

FIG. 8B illustrates the tunability $T_{esp}(\omega,V)$ (a) of the equivalent varactor compared to the tunability of serial (c) and parallel (b) tank implementations. The case when a simple varactor is used is also illustrated with a dashed-dotted line (d). Here particularly in the three element implementation it is assumed that $C_1$ is selected to be 1.6 pF. Using the formulas above, it can be established that $C_2$ will be 0.9625 pF, and L will be 2.74 nH.

With reference to the embodiment shown in FIG. 7A, and since the capacitor admittance or the capacitive branch and the resonant branch are opposite in sign and tuned simultaneously, the circuit arrangement will show a tunability which is significantly higher than the tunability of any of the branches or elements taken separately. The capacitance-voltage dependence is given by $$C(V) = \frac{C(0)}{\sqrt{1+V}}$$

Hence, according to the invention it gets possible to realize varactors or circuit arrangements with an increased tunability in a limited frequency band. This is advantageous since many devices can be designed for substantially narrow band applications which enables a significant miniaturization of existing or new components. Another positive effect is that the manufacturing costs will be considerable reduced.

Since the tunability is frequency dependent, the frequency dependency can be taken advantage of in various components. One example is in a phase-shifter with frequency dependence in differential phase shift.

Figure 9:
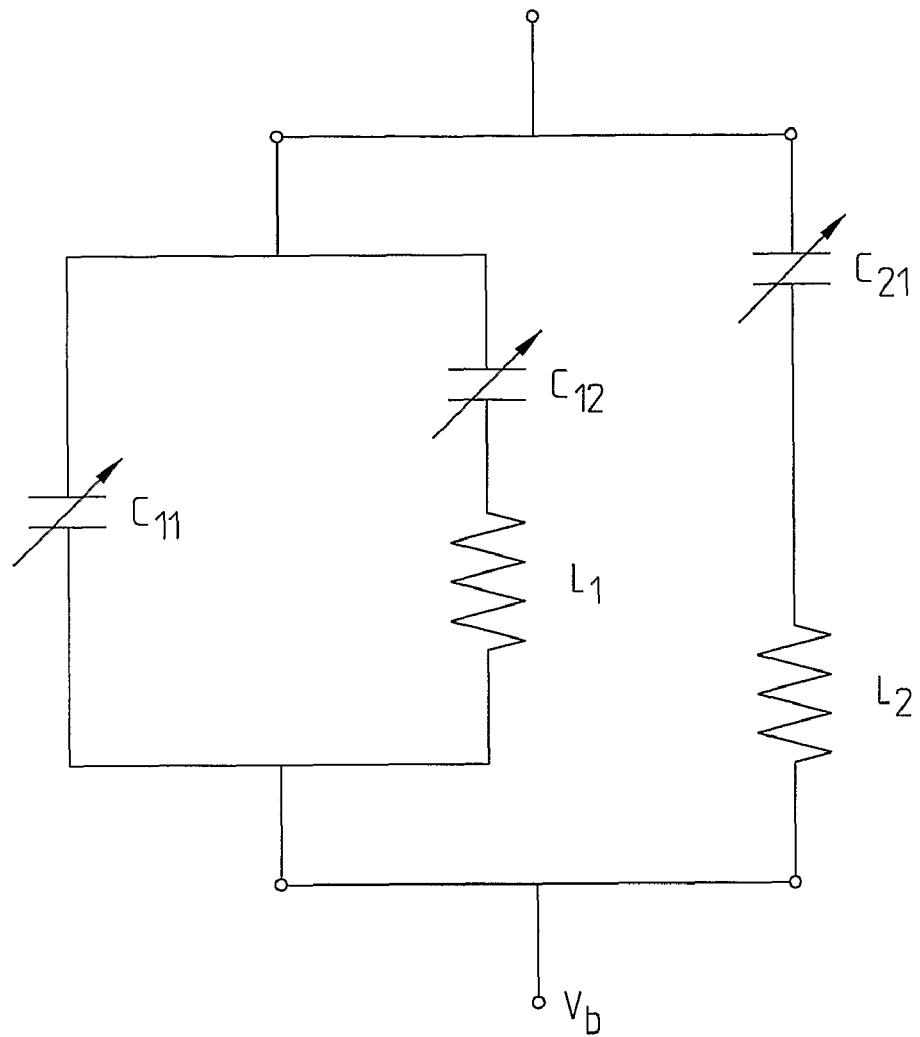

It should be clear that the inventive concept can be implemented and applied in a number of different applications. In an alternative embodiment it comprises five active components instead of three active components, cf. FIG. 9 wherein the resonant branch comprises a capacitor $C_{21}$ in series with an inductor $L_2$ and the capacitive branch comprises an arrangement substantially as in FIG. 7A, with a first capacitor $C_{11}$ connected in parallel with a secondary first capacitor $C_{12}$ in series with an inductor $L_1$ and wherein the arrangement is biased through the application of a biasing voltage $V_b$ and where the equivalent capacitance or the capacitance of the capacitive branch is of the same order magnitude as the capacitance $C_{21}$. Hence, with more elements, the tunability will be even higher than for a three component arrangement. Hence it can be seen that various circuit arrangements can be tailored for the particular needs and applications and advantage can be taken of a particularly high tunability in a selected frequency range.

It should be clear that the invention can be varied in a number of ways and it is not limited to the specifically illustrated embodiments but, on the contrary, it can be varied in a number of ways within the scope of the appended claims.

The invention claimed is:

1. A tunable circuit comprising:
   at least one capacitive branch with at least a tunable first capacitor and tuning application means;
   at least one resonant branch comprising at least a second capacitor and an inductor, said second capacitor and said inductor being connected in series,
   wherein said at least one capacitive branch and said at least one resonant branch are connected in parallel, said tuning application means being adapted for application of a DC tuning voltage;
   wherein a capacitance of said first and/or second capacitor and/or an inductance of said inductor are selected such that a frequency dependency of the tunability of a varactor arrangement forming an equivalent varactor arrangement can be controlled at least in a selected frequency range; and
   wherein the capacitance of the second capacitor is selected to give a given frequency dependence or a frequency dependence with a given maximum deviation or tolerance in said frequency range.

2. The tunable circuit according to claim 1, wherein the capacitance of the second capacitor is of substantially the same order of magnitude as the capacitance of at least the tunable first capacitor.

3. The tunable circuit according to claim 1, wherein the capacitance of at least the tunable first capacitor and the second capacitor are variable.

4. The tunable circuit according to claim 1, wherein the capacitance of at least one of said at least the tunable first capacitor and the second capacitor is variable.

5. The tunable circuit according to claim 1, wherein the at least the tunable first capacitor and/or the second capacitor and/or the inductor are selected so that tunability of the tunable circuit in a given or selected frequency range is substantially frequency independent, or frequency independent with a given allowed deviation of frequency dependent within specified limits.

6. The tunable circuit according to claim 1, wherein the capacitance of the second capacitor is so selected that the equivalent capacitance or the tunability of the tunable circuit in a given or selected frequency range is substantially frequency independent, or frequency independent with a given allowed deviation or frequency dependent within specified limits .

7. The tunable circuit according to claim 1, wherein the at least the tunable first capacitor or the at least one capacitive branch is tunable.

8. The tunable circuit according to claim 7, wherein the second capacitor, or the at least one resonating branch, is tunable to one of (i) a limited extent, or (ii) considerably less than the first capacitor.

9. The tunable circuit according to claim 1, wherein the equivalent capacitance is given by the frequency ranges where a frequency $\omega$ is higher than a parallel resonant frequency $\omega_{2p}$.

10. The tunable circuit according to claim 1, wherein the at least one capacitive branch comprises a first variable capacitance arrangement with the first capacitor connected in series with a secondary first capacitor connected in series with a secondary inductor, and further wherein the resonating branch comprises the second capacitor connected in series with the first inductor having five active elements.

11. The tunable circuit according to claim 1, wherein at least one of the at least the tunable first capacitor, second capacitor and inductor are made of a ferroelectric material, including BaSrTiU3, BSTO, with a tunable dielectric constant.

12. The tunable circuit according to claim 1, wherein at least one of the at least the tunable first capacitor, second capacitor and inductor are made of a polymer material or a liquid crystal material.

13. The tunable circuit according to claim 1, wherein at least one of the at least the tunable first capacitor, second capacitor and inductor are made of a superconducting material, a high or a low temperature superconducting material, e.g. YBCO.

14. The tunable circuit according to claim 1, having a size of approximately 5-20 ×30-70 µm, preferably 10 ×50 µm.

15. The tunable circuit according to claim 1, arranged to operate a controllably high tunability of about 1 GHz-10 GHz in the region of 100 GHz to 900 GHz when the, at least the at least the first tunable capacitor and the second capacitor and the inductor are appropriately selected.

16. The tunable circuit according to claim 1, arranged to operate to in a frequency region which is lower than 1 GHz, when the at least the at least the first tunable capacitor and the second capacitor and the inductor, are appropriately selected.

17. The tunable circuit according to claim 1, adapted to be used in a phase shifter, in a tunable filter or in a tunable matching circuit.

18. The tunable circuit according to claim 1, wherein the at least the first tunable capacitor and/or the second capacitor is/are implemented as planar or parallel plate or multilayer varactors in a circular, elliptical, rectangular, square shaped, interdigital or other appropriate shape.

19. A method of providing a tunable circuit or admittance arrangement comprising the steps of:
   providing a capacitive branch with at least one tunable first capacitor, providing a resonant branch with at least a tunable second capacitor and an inductor in series;
   connecting said capacitive and resonant branches in parallel;
   selecting the first or the second capacitor as a reference parameter capacitor;
   fixing a capacitance of the reference parameter capacitor;
   calculating a capacitance of the first or second capacitor not used as the reference parameter capacitor and an inductance of the inductor using the fixed capacitance value, an upper and lower frequency values defining a frequency range, and a maximum allowable tolerance/deviation;
   establishing the frequency range, while giving the maximum allowable tolerance or frequency dependent deviation of a varactor forming an equivalent varactor of the tunable circuit or admittance arrangement; and
   selecting a capacitance of the first and second capacitors and an inductance of the inductor in dependence of one another so that the frequency dependency of tunability of the equivalent varactor arrangement can be controlled.

20. The method according to claim 19, further comprising the step of applying a DC biasing voltage.

21. The method according to claim 19, further comprising the step of establishing a maximum allowable deviation in percentage.

22. The method according to claim 19, wherein the varactors comprising a dielectric substrate with a tunable dielectric constant of BSTO, or of a superconducting material.

* * * * *

UNITED STATES PATENT AND TRADEMARK OFFICE
CERTIFICATE OF CORRECTION

PATENT NO. : 7,936,235 B2
APPLICATION NO. : 11/916583
DATED : May 3, 2011
INVENTOR(S) : Gevorgyan et al.

It is certified that error appears in the above-identified patent and that said Letters Patent is hereby corrected as shown below:

Title Pg, Item (54), Title and in Column 1, Line 1, delete "TUNEABILITY" and insert -- TUNABILITY --, therefor.

In Fig. 4, Sheet 4 of 8, delete "(Cep($\omega$,0)" and insert -- $C_e^p(\omega,0)$ --, therefor.

In Fig. 4, Sheet 4 of 8, delete "(Ces($\omega$,0)" and insert -- $C_e^s(\omega,0)$) --, therefor.

In Column 1, Line 1, delete "TUNEABILITY" and insert -- TUNABILITY --, therefor.

In Column 5, Line 44, delete "$\Omega_{res}$," and insert -- $\omega_{res}$, --, therefor.

Signed and Sealed this
First Day of November, 2011

David J. Kappos
*Director of the United States Patent and Trademark Office*